United States Patent [19]

Nicollian et al.

[11] Patent Number: 5,051,786
[45] Date of Patent: Sep. 24, 1991

[54] PASSIVATED POLYCRYSTALLINE SEMICONDUCTORS QUANTUM WELL/SUPERLATTICE STRUCTURES FABRICATED THEREOF

[75] Inventors: Edward H. Nicollian, Charlotte; Arnold Reiman, Releigh; Raphael Tsu, High Point, all of N.C.

[73] Assignee: MCNC, Research Triangle Park, N.C.

[21] Appl. No.: 426,571
[22] Filed: Oct. 24, 1989
[51] Int. Cl.$^5$ .................... H01L 27/12; H01L 45/00; H01L 49/02
[52] U.S. Cl. ......................... 357/4; 357/16; 357/61; 357/63; 357/59; 357/2
[58] Field of Search .................... 357/16, 17, 4, 4 SL, 357/52, 30 K, 61, 63, 59 G, 2

[56] References Cited

U.S. PATENT DOCUMENTS

| 4,163,237 | 7/1979 | Dingle et al. | |
|---|---|---|---|
| 4,197,141 | 4/1980 | Bozler et al. | 357/59 D |
| 4,401,840 | 8/1983 | Chitre | 357/30 Q |
| 4,546,372 | 10/1985 | Shuskus | 357/2 |
| 4,613,382 | 9/1986 | Katayama et al. | 357/4 |
| 4,689,645 | 8/1987 | Ovshinsky et al. | 357/2 |
| 4,703,336 | 10/1987 | Ovshinsky et al. | 357/2 |
| 4,722,879 | 2/1988 | Ueno et al. | 430/57 |
| 4,730,207 | 3/1988 | Yamazaki | 357/4 |
| 4,745,452 | 5/1988 | Sollner | 357/4 |
| 4,814,837 | 3/1989 | Kirchoefer | 357/4 |
| 4,828,935 | 5/1989 | Jonker et al. | 357/52 |
| 4,835,006 | 5/1989 | Grasser et al. | 427/58 |
| 4,851,302 | 7/1989 | Nakagawa et al. | 357/61 |
| 4,943,837 | 7/1990 | Konishi et al. | 437/937 |
| 4,959,106 | 9/1990 | Nakagawa et al. | 357/16 |

FOREIGN PATENT DOCUMENTS 61-27681  2/1986  Japan .............................. 357/4 SL

OTHER PUBLICATIONS

Seager et al., "Passivation of Grain Boundaries in Polycrystalline Silicon", Appl. Phys. Lett. 34(5), 3/1/79.
Cho et al., "Growth of GaAs Bicrystals", Appl. Phys. Lett. 49(1), 7/7/86.
Ray et al., "Resonant Tunneling Transport . . . Deposition", Appl. Phys. Lett. 48(24), 15 Jun. 86.
Kamins et al., "Hydrogenation of Transistors Fabricated in Polycrystalline Silicon Films", IEEE Elec. Dec. Let., vol. EDL-1, No. 8, 8/1980, pp. 159-161.
Tunneling in Vertical uc-Si/a-Si$_x$C$_y$O$_2$:H/uc-Si Heterostructures, E. Fortunato, R. Martins, I. Ferreira, M. Santos, A. Macarico, L. Guimaraes, First ICAST Conference, Asheville, NC, Aug. 1989.
Superlattice and Negative Differential Conductivity in Semiconductors, L. Esaki, R. Tsu, IBM Journal of Research and Development, Jan. 1970, pp. 61-65.
Resonant Tunneling Oscillations in a GaAs-Al$_x$Ga$_{1-x}$As Heterostructure at Room Temperature, J. J. Shewchuk, P. C. Chapin, P. D. Coleman, W. Koop, R. Fischer, H. Morkoc, Appl. Phys. Lett. 46(5), 1 Mar. 1985, pp. 508-510.
Tunneling in a Finite Superlattice, R. Tsu and L. Esaki, Appl. Phys. Lett., vol. 22, No. 11, 1 Jun. 1973, pp. 562-564.
Resonant Tunneling in Semiconductor Double Barriers, L. L. Chang, L. Esaki and R. Tsu, Appl. Phys. Lett., vol. 24, No. 12, 15 Jun. 1974, pp. 593-594.

*Primary Examiner*—Rolf Hille
*Assistant Examiner*—Minhloan Tran
*Attorney, Agent, or Firm*—Bell, Seltzer, Park & Gibson

[57] ABSTRACT

The internal grain boundaries and intergranular spaces of polycrystalline semiconductor material may be passivated with an amorphous material, to substantially eliminate the dangling bonds at the internal grain boundaries. The passivated polycrystalline material of the present invention exhibits a lower electrically active defect density at the grain boundaries and intergranular space compared to unpassivated polycrystalline material. Moreover, large classes of amorphous passivating materials may be used for each known semiconductor material so that the passivating process may be readily adapted to existing process parameters and other device constraints. Passivated polycrystalline material may be employed to form the well or low energy bandgap layer of a quantum well device or superlattice, while still maintaining the required tunneling effect. By freeing quantum well devices from the requirement to use monocrystalline well material deeper wells may be produced, and a wider range of materials may be used, with high yields and low cost processes.

13 Claims, 3 Drawing Sheets

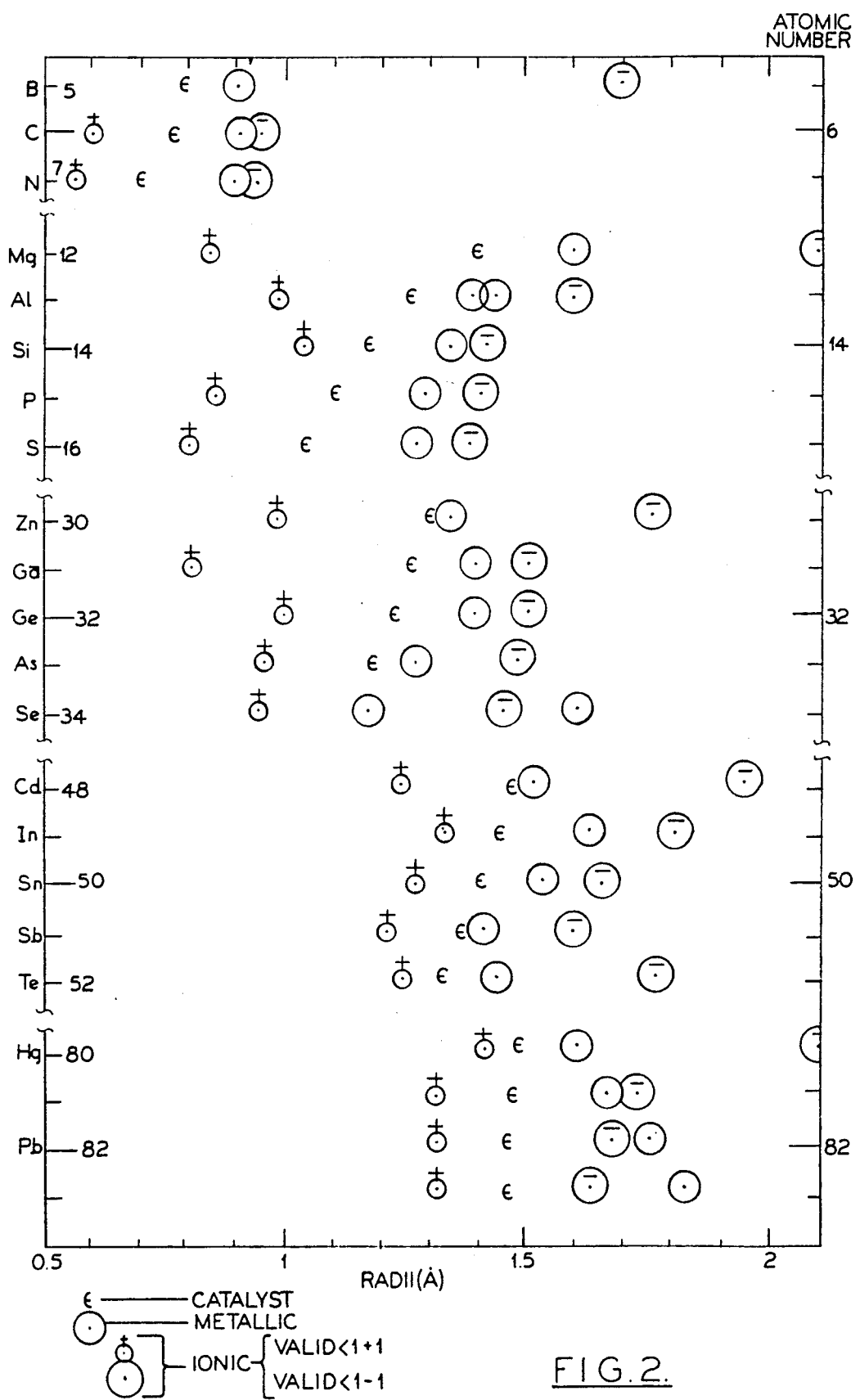

PASSIVATED POLYCRYSTALLINE SEMICONDUCTORS QUANTUM WELL/SUPERLATTICE STRUCTURES FABRICATED THEREOF

FIELD OF THE INVENTION

This invention relates to microelectronic device structures and fabrication methods, and, more specifically, to improved polycrystalline materials for use in microelectronic devices including quantum well structures and superlattices.

BACKGROUND OF THE INVENTION

Microelectronic devices are typically fabricated of thin films of single element semiconductor materials such as silicon and germanium, or of multi-element semiconductor materials such as gallium arsenide. These semiconductor materials exist in three forms: monocrystalline, polycrystalline and amorphous. In monocrystalline structures (also referred to as "crystalline", "single crystal" or "c-" structures) the atoms are periodically arranged throughout the entire structure. In polycrystalline ("poly" or "pc-") structures, the solid is composed of many small single crystal regions. Amorphous ("a-") materials are devoid of any long range periodic structure.

In polycrystalline material, the basic periodicity of the crystal is found within any single crystal region. The single crystal regions, typically on the order of 1000 Å in size, are referred to as grains, and are separated from one another by grain boundaries. The grain boundaries are composed of disordered atoms, and contain large numbers of defects due to incomplete bonding, often referred to as "dangling bonds". Intergranular spaces, devoid of any material may also be present. Thus, while the material inside the grains behaves similarly to crystalline material, the defects and departures from periodicity at the grain boundaries substantially alter the behavior of the poly material.

Polycrystalline semiconductor materials have many important applications in microelectronic device technology. For example, heavily doped polysilicon films have been widely used as gate electrodes and interconnections in metal oxide semiconductor (MOS) field effect transistor (FET) devices. Heavily doped polysilicon devices have also been used to form emitter structures in advanced bipolar technologies. Lightly doped polysilicon films have also been used as high valued load resistors in static memories and to refill trenches employed to isolate one device from another in very large scale integration (VLSI) devices. In these applications it is known to form a thin silicon dioxide ($SiO_2$) layer on the polycrystalline layer to insulate the polycrystalline layer from an overlying layer.

The use of polycrystalline materials has been limited, however, because of the undesirable properties created by the grain boundaries and intergranular spaces which are inherent to the polycrystalline structure. In particular, the grain boundaries and intergranular spaces substantially alter the electronic properties of the material, serving as barriers and scattering centers of carriers such as electrons.

One class of microelectronic devices in which polycrystalline material has not heretofore been used is the class of ultra-thin multilayer devices including quantum well devices and superlattices. A quantum well device is a double barrier structure having a thin (on the order of tens of Ångstroms) well usually formed of low bandgap material, sandwiched between barrier layers usually formed of high bandgap material, to create a band-edge offset therebetween. Resonant tunneling in quantum well devices was observed as early as 1974 by L. L. Chang, L. Esaki and R. Tsu, in an article entitled "Resonant Tunneling in Semiconductor Double Barriers" (Applied Physics Letters, Vol. 24, No. 12, June 15, 1974). Quantum well devices have been extensively used for base and emitter regions of bipolar transistors and for field effect transistor gate regions.

A superlattice is a multilayer thin film structure consisting of multiple alternating layers of high and low bandgap material. Superlattices have been studied since as early as 1970 in an article entitled "Superlattice and Negative Differential Conductivity in Semiconductors" by L. Esaki and R. Tsu (IBM Journal of Research and Development, Vol. 14, page 61, January, 1970). Resonant tunneling in multibarrier structures has been studied since 1973 in an article entitled "Tunneling in a Finite Superlattice" by R. Tsu and L. Esaki (Applied Physics Letters Vol. 22 No. II, June 1, 1973). Superlattice structures are presently being used or under investigation for lasers, optical modulators, radiation hardened devices and other applications. Both quantum wells and superlattices rely on the phenomena of tunneling, in which electrons are trapped in a narrow, deep well which results from the thin layer being sandwiched between two barrier layers.

The materials suitable for use in quantum well/superlattice devices have heretofore been severely limited. Available materials have been limited because the well layer must be formed of monocrystalline material, in order to maintain tunneling. Tunneling is a manifestation of the wave nature of the electron, which is capable of transmission and reflection from a barrier. Electrons maintain coherence if the length of the well is less than the mean free path of the electron waves. In other words, if random scattering events occur in the well, thereby destroying the predictability of the electron waves within the well, the electron waves lose their coherence. Due to their regular molecular structure crystalline materials have no or few scattering events. Therefore, crystalline structures must be used to form the well portion of a quantum well. It is well accepted that polycrystalline materials have many scattering events, due to their irregular nature at the grain boundaries, thereby resulting in the loss of electron wave coherence. Consequently, polycrystalline materials have not been used for the well portion of quantum well structure.

The need to use monocrystalline materials in the well layer severely limits the available materials because the well layer must be formed on one of the barrier layers. It is well known in the semiconductor art that a monocrystalline layer can only be formed upon an underlying monocrystalline layer, in a process known as epitaxy. In a quantum well device, the underlying barrier layer must therefore be a monocrystalline layer. Moreover, not just any monocrystalline material may be employed. A high degree of lattice match between the barrier and well layers is required to produce a high quality epitaxial layer. For example, an excellent barrier on silicon is amorphous silicon dioxide. However, it is not possible to grow a silicon layer epitaxially on the amorphous layer in order to build a quantum well.

SUMMARY OF THE INVENTION

It is an object of the present invention to provide passivation of polycrystalline materials to improve their internal electrical characteristics.

It is another object of the present invention to provide quantum wells and superlattices which do not require the use of monocrystalline materials.

It is yet another object of the present invention to provide a wide range of materials for use in quantum wells and superlattices.

These and other objects of the present invention are achieved by passivating the internal grain boundaries and intergranular spaces of polycrystalline material using an amorphous material to substantially eliminate the dangling bonds at the internal grain boundaries. For example, for polycrystalline silicon, the passivating agents may be amorphous silicon dioxide, amorphous phosphorus, amorphous phosphorus oxide, and amorphous silicon germanium oxide. For polycrystalline germanium, the following passivating agents are effective: amorphous germanium oxide, amorphous phosphorus, amorphous phosphorus oxide, amorphous germanium silicon oxide. For III-V compound semiconductors such as gallium arsenide or indium phosphide, the following passivating agents are effective: amorphous selenium, amorphous tellurium, amorphous sulfur, amorphous germanium, amorphous arsenic selenium, amorphous indium selenium, amorphous gallium oxide, amorphous germanium selenium and amorphous gallium selenium. Hydrogen may also be employed as an additional passivating agent in combination with any of the above passivating agents to passivate any residual dangling bonds not passivated by the above passivating agents.

The passivated polycrystalline material of the present invention exhibits a lower strain, lower scattering center energy barrier, and lower density of localized defects and trapping centers compared to unpassivated polycrystalline material. Moreover, large classes of amorphous passivating material may be used for each known semiconductor material so that the passivating processing may be readily adapted to existing process parameters and other device constraints.

Unexpectedly, according to the present invention, it has been found that the passivated polycrystalline material of the present invention may be employed to form the well of a quantum well device or superlattice, while still maintaining the required tunneling effect. By freeing quantum well devices from the requirement to use monocrystalline well material, a wider range of materials may be used, with high yields and low cost processes. Importantly, for the first time a quantum well structure may be fabricated of a polycrystalline silicon well, sandwiched between amorphous silicon dioxide barriers. A deep well with about 3.2 electron volts band-edge offset may now be produced using two of the most widely used materials in microelectronic device fabrication.

The quantum well structure of the present invention incorporates a first barrier layer, a second barrier layer and a passivated polycrystalline well between the first and second barrier layers. Usually the barrier layers consist of high energy bandgap material and the well consists of a low energy bandgap material. However, the barrier layers may be lower bandgap material than the well. The polycrystalline material has grain boundaries which have dangling bonds and intergranular space between the grain boundaries. An amorphous passivating agent is applied to the polycrystalline material which satisfies the dangling bonds and fills the intergranular space. The passivation complements the structure of the polycrystalline material so that electrons traveling through the polycrystalline material retain their coherence for a much longer distance. Thus, the polycrystalline material has an increased mean free path and becomes appropriate for use in quantum well structures. Quantum well structures incorporating polycrystalline energy wells can also be layered into a superlattice structure.

The amorphous passivating agent may be introduced into the polycrystalline material using a number of conventional methods depending on the polycrystalline material: thermal growth, plasma assisted chemical vapor deposition, ion implantation, evaporation, electron beam deposition, and sputtering. The quantum well can thereby be formed using conventional semiconductor manufacturing technologies.

BRIEF DESCRIPTION OF THE DRAWINGS

FIG. 2 is a chart comparing the covalent and ionic radii of various elements.

DESCRIPTION OF THE PREFERRED EMBODIMENT

The present invention will now be described more fully hereinafter with reference to the accompanying drawings, in which a preferred embodiment of the invention is shown. This invention may, however, be embodied in many different forms and should not be construed as limited to the embodiment set forth herein; rather, Applicants provide this embodiment so that this disclosure will be thorough and complete, and will fully convey the scope of the invention to those skilled in the art.

Like characters refer to like elements throughout. For greater clarity, the size of the elements has been exaggerated.

Referring now to FIG. 1, a quantum well device according to the present invention will now be described. As shown in FIG. 1, the quantum well device is a three layer device including a well layer 14, usually formed of a low bandgap material, sandwiched between barrier layers 13 and 15, usually formed of a high bandgap material. According to the present invention, the well layer may be formed of passivated polycrystalline silicon. It will be understood by those having skill in the art that appropriate device contacts to the barrier layers 13 and 15 are also provided. A superlattice comprises a set of alternating well and barrier layers, in other words a repetition of the structure shown in FIG. 1A and is shown in FIG. 1C. In present technology the quantum well structures and superlattices are typically on the order of tens of Ångstroms in thickness.

It will be understood by those having skill in the art that the barrier region usually consists of a high bandgap layer and the well usually consists of a low bandgap layer. However, the terms high bandgap and low bandgap are relative terms. More specifically, the intermediate layer usually has a first bandgap and the surrounding layers have a bandgap which is higher than the first bandgap, resulting in barriers. It will also be understood by those having skill in the art that the barrier layers may be lower bandgap material than the well layer. Thus, for example in the conduction band of a silicon/germanium heterostructure, the silicon forms the well, whereas the lower bandgap germanium forms the barrier. Typically the surrounding layers are identical so that they have the same bandgap but this need not be the case. The alternating high and low bandgap structure provides the quantum well structure wherein an electron is trapped in a narrow potential well.

Figure 1A:
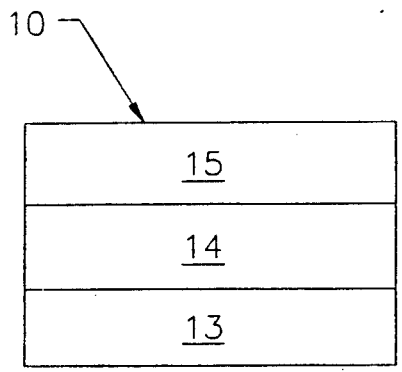
FIGS. 1A and 1B show the structure of a quantum well and an energy band diagram of the quantum well, respectively.
Figure 1B:
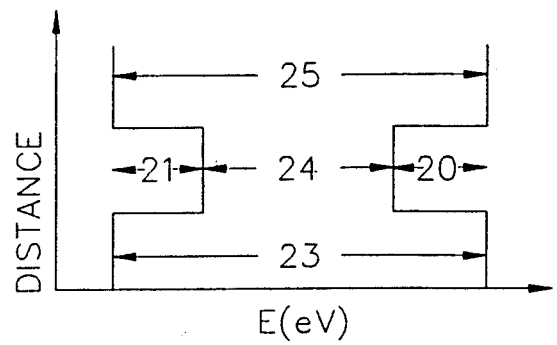
Figure 1C:
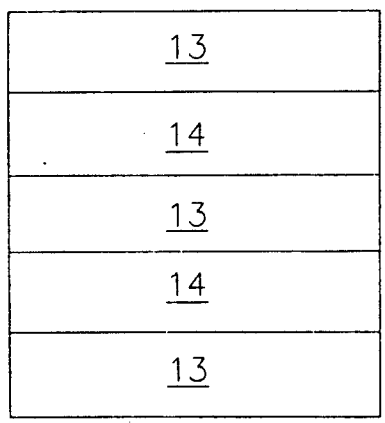
FIG. 1C illustrates a superlattice structure.

Referring to FIG. 1B, an energy band diagram versus distance for the structure of FIG. 1A is shown. Barrier layers 13 and 14 are shown to have a wider bandgap 23 and 25 respectively, than the bandgap 24 of well 14. The band-edge offset for the conduction band is shown as 20 and the band-edge offset for the valence band is shown as 21.

According to the invention, for the first time, polycrystalline material may be employed as a layer in a quantum well or superlattice. This provides the advantage of less expensive fabrication and higher yields. Even more importantly, it opens up a whole new range of well characterized materials to be used in the quantum well or superlattices. Quantum wells and superlattices are freed from lattice matching constraints required of multiple epitaxial layer structures. The passivated polycrystalline layer 14 may be fabricated of polycrystalline silicon, germanium or group III-V compounds. General considerations will first be described. Examples of the fabrication of each will then be described.

Figure 1D:
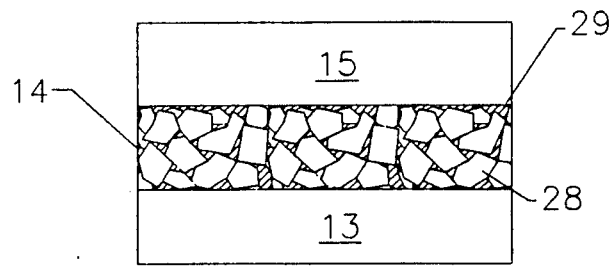
FIG. 1D illustrates a quantum well with a passivated polycrystalline well layer.

In order to passivate a grain boundary of a polycrystalline material, more than one element may be employed. This is so due to the three-dimensional topology and the various types of dangling bonds resulting therefrom. In general, amorphous materials 29 such as amorphous silicon dioxide for polycrystalline silicon and amorphous germanium oxide for polycrystalline germanium can facilitate the formation of bonds on neighboring grains. These amorphous materials 29 facilitate this process by chemically reacting with the polycrystalline material to satisfy dangling bonds on the grains 28 which previously acted as electron traps as seen in FIG. 1D.

An important consideration in passivation involves the location of the anti-bonding and bonding states of the passivating agent with respect to the energy bands of host material. It is well known to those having skill in the art that when two nearby states are coupled, they form a higher state, known as the anti-bonding state, and a lower state, known as the bonding state. For example, if the anti-bonding state of a silicon oxide molecule is close to that of a silicon-silicon bond, which has a silicon atom shared by a silicon atom on one side and an oxygen atom on the other, these states interact leaving a state in the forbidden gap. Since states in the forbidden gap are localized and serve as traps, degeneration in electrical properties results. Therefore, it is important to choose an agent for passivation having as high an anti-bonding state as possible, with the bonding and anti-bonding states being located far outside the bandgap of the host material.

In addition, another aspect of the passivating agent affecting passivation is the covalent and metallic radii. In order for an amorphous material to adequately passivate the grain boundaries of the polycrystalline material, the covalent and metallic radii of the materials need to be as close as possible. This requirement is opposite from establishing stoichiometry in compound semiconductors, in which the covalent and metallic radii are desired to be as far apart as possible. In passivating grain boundaries according to the invention, it is desired to facilitate bonding. Therefore, the closer the radii, the higher the probability of forming various kinds of bonds (ionic, covalent and metallic). Referring to FIG. 2, selenium is a good choice because extra selenium molecules can form metallic bonds with an amorphous structure in addition to those forming covalent bonds in the grain boundary.

Passivation of Polycrystalline Silicon and Germanium

According to the invention, phosphorus forms phosphorus oxide ($P_2O_5$) which is a good bond for metal impurities, or forms amorphous phosphorus in intergranular space serving as a passivating agent. Therefore, amorphous phosphorus and amorphous phosphorus oxide are suitable for the passivation of grain boundaries in both polycrystalline silicon and polycrystalline germanium. Tests indicate that amorphous phosphorus can be used as a passivating agent for polycrystalline silicon and polycrystalline germanium. These tests indicate that highly doped polycrystalline germanium with a phosphorus passivating agent have large grain size (on the order of several micrometers) and narrow Raman lines. Polycrystalline germanium has a Raman linewidth of 8-10 $cm^{-1}$, whereas crystalline germanium has a Raman linewidth of 3 $cm^{-1}$. The phosphorous passivated polycrystalline germanium of the present invention has a Raman linewidth of 4-5 $cm^{-1}$, in addition to conductivity near that of bulk grown crystalline germanium of comparable doping level. For example, with heavy p-type doping, the linewidth and conductivity of polycrystalline germanium is greatly improved. The values obtained are not far from those for bulk Ge crystals (3.6 $cm^{-1}$ and $10^2$ $\Omega^{-1}cm^{-1}$).

An amorphous silicon germanium oxide system also constitutes a good passivating agent for polycrystalline silicon and polycrystalline germanium due to the similar thermal expansion coefficient between the agent and polycrystalline material.

Amorphous silicon dioxide may also be used to passivate the grain boundaries of polycrystalline silicon. Similarly, amorphous germanium oxide may be used for polycrystalline germanium. These oxides are effective passivating agents for these materials because of the amorphous solid's flexibility due to its lack of periodicity. In particular, it is the ability to easily bend the bonds in the Si—O—Si bond and the Si—Si bond and altering the bond angles that allows for easy bonding with the grain boundaries. The bond angles in crystalline materials are fixed, thereby preventing the formation of bonds. Amorphous materials are inherently more accommodating.

Passivation of III-V Compounds

The basic concept of passivating polycrystalline materials with amorphous materials can be expanded to the III-V type compounds, such as GaAs, InP, etc.

The III-V compound semiconductors have an added passivation complication imposed by stoichiometry. For example, suppose amorphous gallium oxide ($Ga_2O_3$) is used as the high energy barrier for an energy well of gallium arsenide (GaAs). Excess arsenic or excess gallium will typically be present inside the polycrystalline gallium arsenide. Consequently, means must be introduced to preserve the stoichiometry of the polycrystalline gallium arsenide grains in order to avoid excess gallium or arsenic from forming metallic clusters. In monocrystalline compounds, the excess is usually manifested as interstitials or vacancies, both serving as scattering centers. Amorphous chalcogenides, such as amorphous selenium or amorphous tellurium, can passivate the III-V compounds. This is so because they can form both covalent as well as metallic bonds. Amorphous chalcogenides are well characterized, and widely used, so that they may be readily adapted as passivating agents. In the event that arsenic is in excess, selenium will form amorphous arsenic selenium ($As_2Se_3$). If gallium is in excess, amorphous gallium selenium (GaSe) will be formed. Since selenium is an n-type dopant for gallium arsenide, the increased carrier concentration will raise the Fermi level of the polycrystalline material, and increased diffusion will result. This increase should augment diffusion of the undesirable impurities in the gallium arsenide from the grain to the grain boundary, thus improving the quality of the material.

Since the covalent radius of germanium matches that of gallium arsenide, germanium may also be a passivating agent for III-V compounds. Similarly, the following amorphous materials may also be used as passivating agents for the III-V compounds: amorphous sulfur, amorphous arsenic selenium, amorphous indium selenium, amorphous gallium oxide, amorphous germanium selenium, and amorphous gallium selenium.

In order to achieve the most thorough passivation, it may be necessary to also include hydrogen and oxygen in any passivation of polycrystalline materials. Oxygen absorbed in molecular form may lower the bonding defects in the amorphous passivating material. Hydrogen also may be used to passivate the residual dangling bonds.

Figure 1E:
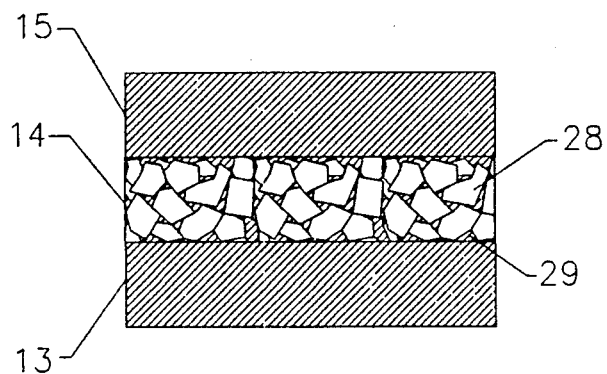
FIG. 1E illustrates a quantum well with a passivated polycrystalline well layer and passivated barrier layers.

Applicants believe that the entire binary and ternary III-V compounds, and their pseudo-binary and pseudo-ternary alloys may be subjected to our passivation scheme. Accordingly, the discussion of GaAs also applies to AlP and to $Al_xGA_{1-x}As_yP_{1-y}$ alloy systems, for example. It should also be noted that the focus of passivation has been the well region. The barrier region may also require passivation, as seen in FIG. 1E, although defects in the barrier regions are not as detrimental as those in the well regions because electrons spend more time in the well region.

EXAMPLE 1:

Polycrystalline Silicon Passivated With Silicon Dioxide

The quantum well structure of FIG. 1 using silicon dioxide passivated polycrystalline silicon may be formed as follows: first, a layer of silicon dioxide, 30 Å thick, is formed on a silicon substrate or appropriate contact to form layer 13. Then, approximately 45 Å of amorphous silicon may be deposited, at low temperatures, below 300° C., on the silicon dioxide layer 13. This amorphous layer may be heated in a dry oxygen ambient at approximately 900° C. for 2-3 minutes. This oxidation simultaneously (1) converts the amorphous silicon layer to a polycrystalline silicon layer 14, the grain boundaries of which are passivated by the thermally grown silicon dioxide, and (2) grows a 30 Å layer of silicon dioxide, to form the second barrier layer 15. In order to form complete passivation, hydrogen may be added as well, by hydrogen plasma, implantation or diffusion. A top contact may then be formed.

Alternative methods of forming polycrystalline silicon passivated with silicon dioxide would involve a thermally grown polycrystalline silicon which may be grown by pyrolyzing silane at 600° C. at a pressure of 10 Pa or less. Alternatively, a plasma assisted chemical vapor deposition of polycystalline silicon may be formed by plasma decomposition of diluted $SiH_2$ gas in $H_2$. Ion implantation may be also be employed by first providing a layer of polycrystalline silicon and then implanting oxygen ions using an energy of 2-5 KeV and a dose of $10^{14} cm^{-2}$ followed by a 1000° C. anneal in argon or hydrogen for 10 sec.

EXAMPLE 2:

Polycrystalline Silicon Passivated With Phosphorous

Figure 1F:
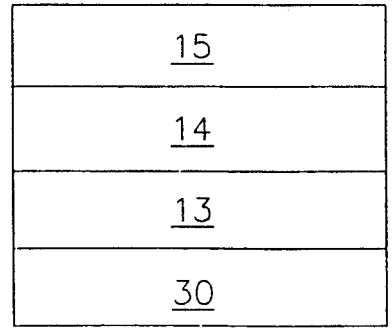
FIG. 1F illustrates a quantum well structure formed on a substrate.
Figure 1G:
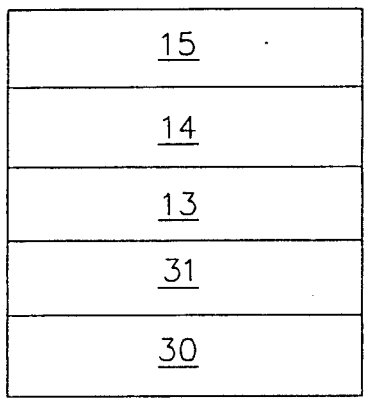
FIG. 1G illustrates a quantum well structure formed on layers of silicon dioxide and silicon.

Quantum well structures of FIGS. 1f and 1G using phosphorous passivated polycrystalline silicon may be formed as follows: first, a layer 30 of amorphous $SiO_2$, 30 Ångstroms thick is formed on the substrate or appropriate contact to form layer 13. Then, approximately 30 Ångstroms of polycrystalline silicon 31 with 1% phosphorous is deposited on the amorphous $SiO_2$ layer 13. In order to form complete passivation, hydrogen may be added as well, by diffusion or implantation. Alternatively, $PH_3$ gas plasma may be used to introduce both P and H into polycrystalline Si.

A detailed process for producing the quantum well of FIG. 1 using phosphorous passivated polycrystalline silicon will now be described:

Step I: Amorphous $SiO_2$ is thermally grown on a Si wafer at 900° C.

Step II: Polycrystalline Si is evaporated on the amorphous $SiO_2$ at a substrate temperature from room temperature to 55020 C.

Step III: The polycrystalline Si is subjected to a $PH_3$ gas plasma at a temperature of 350° C. to 450° C. in order to introduce P as well as H into the polycrystalline silicon.

Step IV: A second amorphous $SiO_2$ layer is thermally grown at 900° C. in dry oxygen.

Step V: A final annealing is performed to remove the residual dangling bonds by hydrogenation.

As an alternative to Step III, a chemical vapor deposition (CVD) process instead of plasma deposition may be used. For a CVD process, the substrate temperature should be increased to thermally break down $PH_3$, for example at a temperature of 600° C. Alternatively, ion implantation of P may be used, at an ion dosage of approximately $10^{14} cm^{-2}$ to $10^{15} cm^{-2}$.

Example 3:

Polycrystalline Silicon Passivated With Phosphorous Oxide

A quantum well structure of FIG. 1 using passivated polycrystalline silicon may be formed as follows: first, a layer of amorphous $SiO_2$ 30 Ångstroms thick is formed on the substrate or appropriate contact to form layer 13.

Then, approximately 30 Ångstroms of polycrystalline silicon with 1% phosphorous deposited on amorphous + SiO$_2$ layer 13. In order to form a complete passivation hydrogen may be added as well, by diffusion or implantation. Alternatively, PH$_3$ gas plasma may be used to introduce both P and H into polycrystalline silicon.

Phosphorous oxide passivated polycrystalline silicon may be produced using the five step process described in Example 2, except that in Step III a PH$_3$ and O$_2$ gas plasma is used.

EXAMPLE 4:

Polycrystalline Silicon Passivated With Silicon Germanium Oxide

A quantum well structure of FIG. 1 using silicon germanium oxide passivated polycrystalline silicon may be formed as described in Example 3, except that approximately 30 Å of polycrystalline silicon with 1% germanium is formed, and hydrogen may be added by GeH$_4$+O$_2$ gas plasma to introduce Ge and O into the polycrystalline silicon. The five step process of Example 3 may be employed, except that in Step III, GeH$_4$+O$_2$ gas plasma is used.

EXAMPLE 5:

Polycrystalline Germanium Passivated With Germanium Oxide

A quantum well structure of FIG. 1 using germanium oxide passivated polycrystalline silicon may be formed as follows: first, a layer of amorphous SiO$_2$, 30 Ångstroms thick is formed on a substrate or appropriate contact to form layer 13. Then, approximately 30 Å of amorphous germanium may be deposited on the amorphous SiO$_2$ layer 13. In order to form a complete passivation, hydrogen may be added as well, by using GeH$_4$+O$_2$ gas plasma to introduce germanium and oxygen into the polycrystalline germanium.

A detailed process for producing the quantum well of FIG. 1 using germanium oxide passivated polycrystalline germanium will now be described:

Step I: Amorphous SiO$_2$ is thermally grown on a silicon wafer at 900° C. in dry oxygen.

Step II: Polycrystalline germanium is evaporated on the amorphous SiO$_2$ at a temperature from room temperature to 350° C.

Step III: Thermal oxidation of the polycrystalline germanium is done at a temperature of 800° C. in dry oxygen.

Step IV: A final annealing is performed to remove the residual dangling bonds be hydrogenation.

EXAMPLE 6:

Polycrystalline III-V Compound Passivated with Selenium

It has been found according to the invention that selenium passivated polycrystalline III-V compounds may be formed using the following passivating agents: amorphous-selenium, amorphous-tellurium, amorphous-sulphur, amorphous-germanium, amorphous-arsenic selenium, amorphous-indium selenium, amorphous-gallium oxide, amorphous-germanium selenium, and amorphous-gallium selenium. Complete passivation may require the addition of hydrogen and oxygen as secondary passivating agents.

Figure 1H:
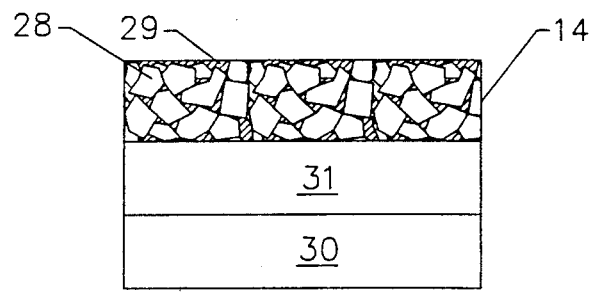
FIG. 1H illustrates a passivated polycrystalline layer formed on layers of silicon dioxide and silicon.
Figure 1I:
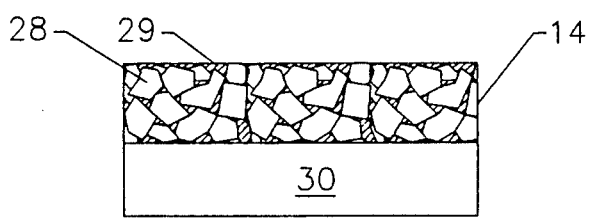
FIG. 1I illustrates a passivated polycrystalline layer formed on a silicon layer.

Silicon does not have a direct energy gap, unlike GaAs which has a direct energy gap. Silicon therefore does not lend itself to applications involving interaction with light. For applications requiring interaction with light it is necessary to grow pc-GaAs on silicon. The resulting GaAs will be passivated by the amorphous agents stated above. For Example, in order to deposit a layer of pc-GaAs 1000 Å thick on a silicon wafer, having well passivated grain boundaries as seen in FIGS. 1H and 1I, the following steps may be performed:

Step I: Polycrystalline GaAs, 50 Å thick, is evaporated at a substrate temperature of 500° C., on a silicon wafer 30 having a 30 Å amorphous SiO$_2$ 31 thermally grown layer thereon.

Step II: Amorphous selenium 5 Å thick is evaporated onto the polycrystalline GaAs at a substrate temperature of 200° C.

Step III: Annealing is done at 500° C. in vacuum to incorporate the amorphous selenium into the grain boundaries. If a thicker layer is desired, this process may be repeated. Self-annealing is effected during the second deposition of the polycrystalline. This example of using selenium may be replaced by tellurium using the same steps.

When the polycrystalline GaAs is to be a quantum well, a second barrier material needs to be deposited on the polycrystalline GaAs layer. Such a barrier material may be for example, AlAs. In this case, the following steps are involved:

Step I: Deposition by vapor evaporation of (50 Å) GaAs on 30 Å amorphous SiO$_2$ thermally grown on a silicon wafer.

Step II: Deposition of 5 Å amorphous selenium at 200° C.

Step III: Annealing at 500° C. in vacuum.

Step IV: Deposition of 30 Å polycrystalline AlAs at 500° C. as a second barrier. Amorphous selenium serves to passivate the polycrystalline GaAs, sandwiched between 30 Å of amorphous SiO$_2$ and 30 Å of polycrystalline AlAs, as well as the barrier layer consisting of polycrystalline AlAs.

In the drawings and specification, there have been disclosed typical preferred embodiments of the invention and, although specific terms are employed, they are used in a generic and descriptive sense only and not for purposes of limitation, the scope of the invention being set forth in the following claims.

That which we claim is:

1. A quantum well structure for a semiconductor device comprising:

first and second barrier layers; and a passivated polycrystalline semiconductor well layer formed between said first and said second barrier layers, said passivated polycrystalline semiconductor well layer and said first and second barrier layers having a band-edge offset therebetween; said passivated polycrystalline semiconductor well layer comprising a plurality of crystalline grains having internal grain boundaries therebetween, said internal grain boundaries having dangling bonds thereat, and an amorphous passivating agent in said grain boundaries for bonding to said dangling bonds, wherein said plurality of crystalline grains comprise silicon grains and wherein said amorphous passivating agent comprises at least one of amorphous-silicon dioxide, amorphous-phosphorous, amorphous-phosphorous oxide, and amorphous-silicon germanium oxide.

2. A quantum well structure for a semiconductor device comprising:

first and second barrier layers; and a passivated polycrystalline semiconductor well layer formed between said first and said second barrier layers, said passivated polycrystalline semiconductor well layer and said first and second barrier layers having a band-edge offset therebetween; said passivated polycrystalline semiconductor well layer comprising a plurality of crystalline grains having internal grain boundaries therebetween, said internal grain boundaries having dangling bonds thereat, and an amorphous passivating agent in said grain boundaries for bonding to said dangling bonds, wherein said plurality of crystalline grains comprise germanium and wherein said amorphous passivating agent comprises at least one of amorphous-germanium oxide, amorphous-phosphorous,, amorphous-phosphorous oxide, and amorphous-germanium silicon oxide.

3. A quantum well structure for a semiconductor device comprising:

first and second barrier layers; and a passivated polycrystalline semiconductor well layer formed between said first and said second barrier layers, said passivated polycrystalline semiconductor well layer and said first and second barrier layers having a band-edge offset therebetween; said passivated polycrystalline semiconductor well layer comprising a plurality of crystalline grains having internal grain boundaries therebetween, said internal grain boundaries having dangling bonds thereat, and an amorphous passivating agent in said grain boundaries for bonding to said dangling bonds, wherein said plurality of crystalline grains comprise a III-V compound and wherein said amorphous passivating agent comprises at least one of amorphous-selenium, amorphous-tellurium, amorphous-sulphur, amorphous-germanium, amorphous-arsenic selenium, amorphous-indium selenium, amorphous-gallium oxide, amorphous-germanium selenium, and amorphous-gallium selenium.

4. The quantum well structure of claims 1, 2 or 3 wherein a superlattice is formed by combining at least two of said quantum well structures.

5. The quantum well structure of claims 1, 2 or 3 wherein said passivated polycrystalline semiconductor well layer has an energy bandgap which is lower than energy bandgaps of said first and second barrier layers.

6. The quantum well structure of claims 1, 2 or 3 wherein said first barrier layer is formed on a semiconductor substrate.

7. The quantum well structure of claim 6 wherein said semiconductor substrate comprises a silicon substrate having an insulating amorphous silicon dioxide layer thereon.

8. The quantum well structure of claim 7 wherein said first and second barrier layers comprise gallium aluminum arsenide.

9. The quantum well structure of claim 8 wherein said first and second barrier layers comprise passivated polycrystalline gallium aluminum arsenide.

10. A passivated polycrystalline semiconductor material comprising:

a polycrystalline semiconductor material including a plurality of crystalline grains having internal grain boundaries therebetween, said internal grain boundaries having dangling bonds thereat; and an amorphous passivating agent in said grain boundaries for bonding to said dangling bonds; wherein said passivated polycrystalline semiconductor material comprises silicon, and wherein said amorphous passivating agent comprises at least one of amorphous-silicon dioxide, amorphous-phosphorous, amorphous-phosphorus oxide, and amorphous-silicon germanium oxide.

11. A passivated polycrystalline semiconductor material comprising:

a polycrystalline semiconductor material including a plurality of crystalline grains having internal grain boundaries therebetween, said internal grain boundaries having dangling bonds thereat; and an amorphous passivating agent in said grain boundaries for bonding to said dangling bonds; wherein said passivated polycrystalline semiconductor material comprises germanium, and wherein said amorphous passivating agent comprises at least one of amorphous-germanium oxide, amorphous-phosphorous, amorphous-phosphorous oxide, and amorphous-germanium silicon oxide.

12. A passivated polycrystalline semiconductor material comprising:

a polycrystalline semiconductor material including a plurality of crystalline grains having internal grain boundaries therebetween, said internal grain boundaries having dangling bonds thereat; and an amorphous passivating agent in said grain boundaries for bonding to said dangling bonds; wherein said passivated polycrystalline semiconductor material comprises a group III-V compound, and wherein said amorphous passivating agent comprises at least one of amorphous-selenium, amorphous-tellurium, amorphous-sulphur, amorphous-germanium, amorphous-arsenic selenium, amorphous-indium selenium, amorphous-gallium oxide, amorphous-germanium selenium, and amorphous-gallium selenium.

13. The passivated polycrystalline semiconductor material of claim 12 in combination with a silicon substrate having an insulating amorphous silicon dioxide layer thereon.

* * * * *

UNITED STATES PATENT AND TRADEMARK OFFICE
CERTIFICATE OF CORRECTION

PATENT NO. : 5,051,786
DATED : September 24, 1991
INVENTOR(S) : Nicollian et al.

It is certified that error appears in the above-identified patent and that said Letters Patent is hereby corrected as shown below:

Title page, title should read: PASSIVATED POLYCRYSTALLINE SEMICONDUCTORS AND QUANTUM WELL/SUPERLATTICE STRUCTURES FABRICATED THEREOF Column 1, line 3, "SEMICONDUCTORS QUANTUM" should be --SEMICONDUCTORS AND QUANTUM--

Column 8, line 16, "$SiH_2$gas" should be --$SiH_4$ gas--

Column 8, line 44, "55020 C." should be --550° C.--

Column 12, line 21, "phous-phosphorus" should be --phous-phosphorous--

Signed and Sealed this

Second Day of March, 1993

Attest:

STEPHEN G. KUNIN

Attesting Officer

Acting Commissioner of Patents and Trademarks